(12) United States Patent
Silverman et al.

(10) Patent No.: US 9,133,559 B2
(45) Date of Patent: Sep. 15, 2015

(54) METHODS FOR FORMING ELECTROPLATED ALUMINUM STRUCTURES

(75) Inventors: Ken Silverman, San Jose, CA (US); Ronald Moller, Los Gatos, CA (US); Peter Russell-Clarke, San Francisco, CA (US); Christopher D. Prest, San Francisco, CA (US); Rimple Bhatia, Cupertino, CA (US); Paul Choiniere, Livermore, CA (US); Lucy Elizabeth Browning, San Francisco, CA (US); Masashige Tatebe, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 378 days.

(21) Appl. No.: 13/414,542

(22) Filed: Mar. 7, 2012

(65) Prior Publication Data

US 2013/0008796 A1    Jan. 10, 2013

Related U.S. Application Data

(60) Provisional application No. 61/449,855, filed on Mar. 7, 2011.

(51) Int. Cl.
*C25D 5/48* (2006.01)
*C25D 11/02* (2006.01)
(Continued)

(52) U.S. Cl.
CPC *C25D 3/44* (2013.01); *C25D 3/665* (2013.01); *C25D 5/02* (2013.01); *C25D 5/022* (2013.01); *C25D 5/10* (2013.01); *C25D 5/48* (2013.01); *C25D 7/00* (2013.01); *C25D 11/022* (2013.01); *C25D 11/024* (2013.01); *C25D 11/04* (2013.01); *C25D 11/12* (2013.01); *C25D 11/14* (2013.01); *C25D 11/16* (2013.01); *C25D 11/18* (2013.01);
(Continued)

(58) Field of Classification Search
CPC .......... B41M 5/20; B41M 15/01; C25D 5/00; C25D 5/34; C25D 5/48
USPC .................................. 205/50, 171, 205, 223
See application file for complete search history.

(56) References Cited

U.S. PATENT DOCUMENTS

| 4,148,204 A | 4/1979 | Dotzer et al. |
| 5,277,982 A | 1/1994 | Jozefowicz |

(Continued)

FOREIGN PATENT DOCUMENTS

| EP | 1371758 | 12/2003 |
| EP | 1371758 EP | 12/2003 |

(Continued)

OTHER PUBLICATIONS

Hansen, N. "Hall-Petch relation and boundary strengthening" Scripta Materialia, 51, 2004, p. 801-806.*
(Continued)

*Primary Examiner* — Keith Hendricks
*Assistant Examiner* — Stefanie S Wittenberg
(74) *Attorney, Agent, or Firm* — Downey Brand LLP

(57) ABSTRACT

Anodized electroplated aluminum structures and methods for making the same are disclosed. Cosmetic structures according to embodiments of the invention are provided by electroplating a non-cosmetic structure with aluminum and then anodizing the electroplated aluminum. This produces cosmetic structures that may possess desired structural and cosmetic properties and that may be suitable for use as housing or support members of electronic devices.

22 Claims, 14 Drawing Sheets

(51) Int. Cl.
*C25D 11/04* (2006.01)
*C25D 11/12* (2006.01)
*C25D 3/44* (2006.01)
*C25D 7/00* (2006.01)
*C25D 5/02* (2006.01)
*C25D 11/14* (2006.01)
*C25D 11/16* (2006.01)
*C25D 11/24* (2006.01)
*C25D 3/66* (2006.01)
*C25D 5/10* (2006.01)
*C25D 11/18* (2006.01)

(52) U.S. Cl.
CPC ............ *C25D 11/243* (2013.01); *C25D 11/246* (2013.01); *Y10T 428/12764* (2015.01)

(56) References Cited

U.S. PATENT DOCUMENTS

| | | |
|---|---|---|
| 8,123,967 B2 | 2/2012 | Anton et al. |
| 2002/0033340 A1* | 3/2002 | Cheung et al. ............... 205/101 |
| 2010/0008030 A1 | 1/2010 | Weber et al. |
| 2011/0083967 A1* | 4/2011 | Ruan et al. ................... 205/238 |
| 2011/0287281 A1 | 11/2011 | Yamaguchi et al. |
| 2013/0008796 A1 | 1/2013 | Silverman et al. |
| 2013/0136946 A1 | 5/2013 | Liu et al. |
| 2013/0176091 A1 | 7/2013 | Lancaster-Larocque |

FOREIGN PATENT DOCUMENTS

| | | |
|---|---|---|
| JP | H02145795 | 6/1990 |
| WO | WO 91/09991 | 7/1991 |
| WO | WO9109991 | 7/1991 |

OTHER PUBLICATIONS

Yue, G et al., "Surface morphology, crystal structure and orientation of aluminum coatings electrodeposited on mild steel in ionic liquid", Chemical Engineering Journal, 147, 2009, p. 79-86.*
PCT/US2012/028121. Invitation to Pay Additional Fees & Partial Search Report (Dec. 6, 2013).
PCT Application No. PCT/US2012/028121—International Search Report & Written Opinion dated Feb. 18, 2014.
Korean Patent Application No. 10-2013-7026090—Office Action dated Aug. 26, 2014.

* cited by examiner

METHODS FOR FORMING ELECTROPLATED ALUMINUM STRUCTURES

CROSS-REFERENCE TO RELATED APPLICATIONS

This application claims the benefit of U.S. Provisional Patent Application No. 61/449,855 filed Mar. 7, 2011, which is incorporated by reference herein in its entirety.

BACKGROUND

Electronic devices such as computers, cellphones, and portable media devices are often manufactured to exhibit desired cosmetic characteristics. In addition, such devices are manufactured with minimum structural requirements. It is desirable for certain materials used in such devices to exhibit sufficient structural integrity and cosmetic appeal. However, these two qualities can oppose each other depending on the material used. For example, a material may be aesthetically pleasing, but lack the desired structural properties, or alternatively, the material may be structurally sound, but does not exhibit desired cosmetics.

SUMMARY

Anodized electroplated aluminum structures and methods for making the same are disclosed.

In some embodiments, a cosmetic structure may include a non-cosmetic structure having a surface, a qualification layer disposed on the surface, and an electroplated aluminum layer disposed on the qualification layer. The electroplated aluminum layer may have an initial applied thickness ranging between 15 micrometers and 120 micrometers. The cosmetic structure may also include an aluminum anodized layer integrally formed with the electroplated aluminum layer.

In some embodiments, a method for making a cosmetic structure may include providing a non-cosmetic structure, preparing the non-cosmetic structure for an electroplating process, and electroplating the prepared non-cosmetic structure with aluminum to provide an electroplated aluminum structure. The electroplated aluminum layer may have an initial applied thickness ranging between 15 micrometers and 120 micrometers. The method may also include processing the electroplated aluminum structure to obtain a predetermined finish. A portion of the electroplated aluminum may be removed to provide the predetermined finish. The method may also include anodizing the processed electroplated aluminum structure having the predetermined finish to provide the cosmetic structure.

In some embodiments, an electronic device may include a display, a user interface, and a housing for securing the display and user interface. The housing may include a metal having an anodized electroplated aluminum cosmetic finish.

In some embodiments, a cosmetic structure may include a non-cosmetic structure, and an electroplated aluminum layer disposed on the non-cosmetic structure. The electroplated aluminum layer may include first and second dopants each having a different grain structure. The cosmetic structure may also include an aluminum anodized layer integrally formed with the electroplated aluminum layer.

In some embodiments, an article may include an aluminum structure, and an electroplated aluminum layer on the aluminum structure. An oxide layer of the aluminum structure may be removed.

In some embodiments, a method may include providing an aluminum structure, and, in a sealed environment, removing an oxide layer from the aluminum structure, and, after the removing, electroplating the aluminum structure to form an electroplated aluminum layer on the aluminum structure.

In some embodiments, an article may include a non-cosmetic structure. The non-cosmetic structure may include a first portion of a first material type, and a second portion of a second material type. The article may also include a first electroplated layer on the first portion, and a second electroplated layer on the second portion.

In some embodiments, a method may include providing a non-cosmetic structure. The non-cosmetic structure may include a first portion of a first material type, and a second portion of a second material type. The method may also include electroplating the non-cosmetic structure to form a first electroplated layer on the first portion and a second electroplated layer on the second portion.

In some embodiments, an article may include a non-cosmetic structure, a first electroplated layer on the non-cosmetic structure, a first anodized layer on the first electroplated layer, a second electroplated layer on the first anodized layer, and a second anodized layer on the second electroplated layer.

In some embodiments, a method may include providing a non-cosmetic structure, electroplating the non-cosmetic structure to form a first electroplated layer on the non-cosmetic structure, anodizing the first electroplated layer to form a first anodized layer on the first electroplated layer, processing the anodized electroplated structure to remove a portion of the anodized electroplated structure, electroplating the processed anodized electroplated structure to form a second electroplated layer, and anodizing the second electroplated layer to form a second anodized layer on the second electroplated layer.

In some embodiments, a method may include providing a non-cosmetic structure, processing a portion of the non-cosmetic structure, and electroplating the non-cosmetic structure to form an electroplated layer on an unprocessed portion of the non-cosmetic structure. The processing may include at least one of masking and laminating the portion. After the electroplating, the method may include surface finishing the electroplated layer.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Cosmetic structures according to embodiments of the invention are provided by electroplating a non-cosmetic structure and then anodizing the electroplated structure. This can, for example, produce cosmetic structures that possess desired structural and cosmetic properties and that are suitable for use as housing or support members of electronic devices.

Figure 1:
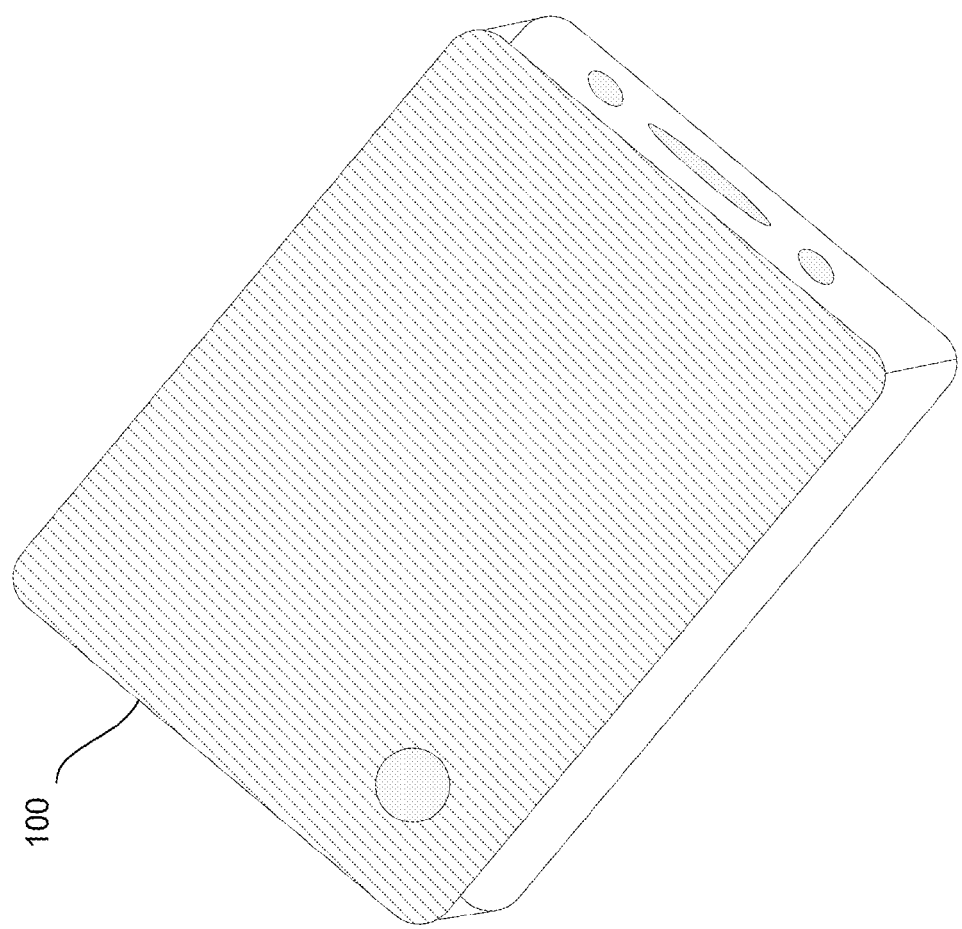
FIG. 1 shows an illustrative non-cosmetic structure that may receive a cosmetic finish in accordance with an embodiment of the invention.

FIG. 1 shows an illustrative non-cosmetic structure 100 that may receive a cosmetic finish in accordance with an embodiment of the invention.

Structure 100 may have any suitable size and shape. For example, structure 100 can have curved surfaces, planar surfaces, edges, cutouts, recesses, cavities, through-holes, threaded holes or cavities, or any combination thereof. As illustrated in FIG. 1, structure 100 can have a combination of curved and planar surfaces, and one or more through-holes.

In some embodiments, structure 100 may be used as a part of an electronic device such as, for example, a portable media player, a smart phone, a laptop computer, or a tablet. Structure 100 may provide structural support for the electronic device and may also be visible to a user. Structural support may be provided in the form of a cover, such as a backplate, or in the form of a frame (e.g., a shell of a laptop body). Because portions of structure 100 may be visible to the user, a cosmetic finish can be applied in accordance with embodiments of this invention.

Structure 100 can be constructed from any suitable material. For example, structure 100 can be constructed from steel or a steel alloy, magnesium, aluminum or an aluminum alloy, or titanium. Each of these metals in their raw and untreated state, however, do not provide the combination of durability and desired cosmetic appearance. Steel, for example, can be polished to exhibit a shiny mirror-like finish, but is susceptible to scratches, which dull the finish, and readily retains oil left behind by fingerprints. Both magnesium and aluminum exhibit undesired cosmetic appearance—that is, they both have a dull finish.

As another example, structure 100 can be constructed from a polymer, a glass embedded plastic, or materials such as ceramic, nylon, carbon fiber, or any combination of two or more of the foregoing. As yet another example, structure 100 can be constructed to include both a metal (e.g., steel, magnesium, or aluminum) and a plastic material. The plastic material may provide a "window" suitable for passage of RF signals. Further, structure 100 may include an assembly or a single part.

Figure 2:
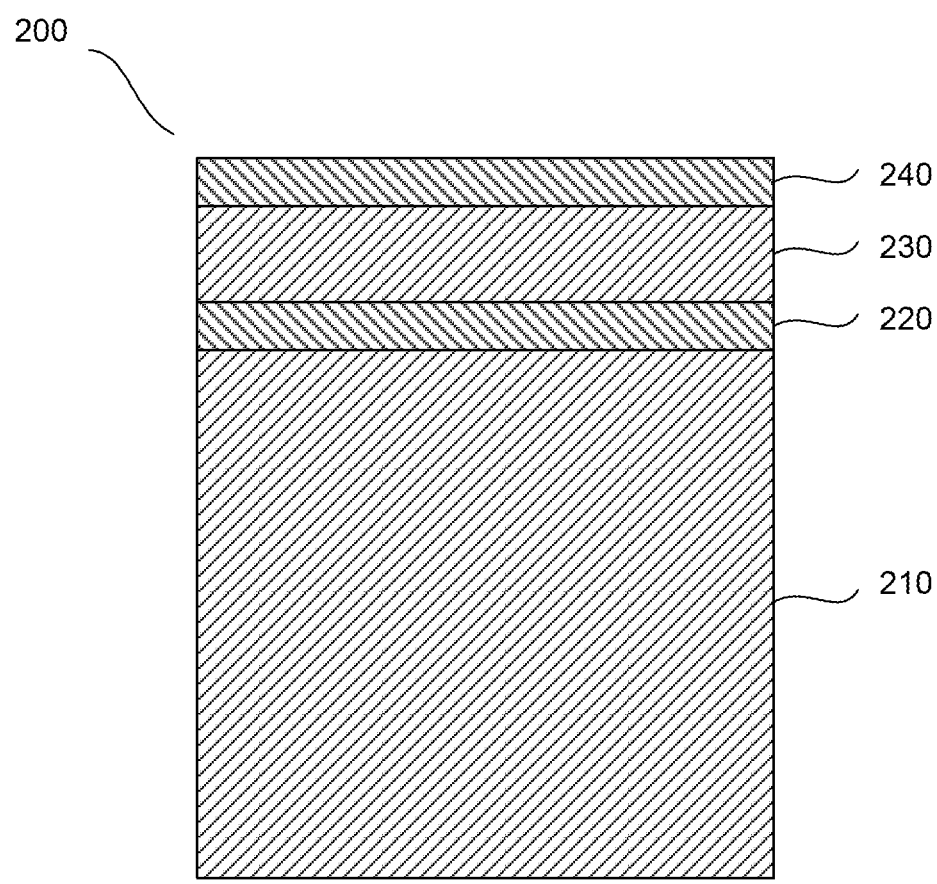
FIG. 2 shows an illustrative cross-sectional view of such a cosmetic structure in accordance with an embodiment of the invention.

Non-cosmetic structures such as structure 100 may be subjected to a cosmetic finishing process according to embodiments of the invention to provide a cosmetic structure. FIG. 2 shows an illustrative cross-sectional view of such a cosmetic structure. As shown, cosmetic structure 200 can include non-cosmetic structure 210, qualification layer 220, electroplated aluminum layer 230, and aluminum anodized layer 240. The thickness of each layer is illustrative and it is understood that the thickness of each layer may vary. In addition, the thickness of structure 210 can also vary.

Non-cosmetic structure 210 can include any suitable structure such as that described above in connection with structure 100 of FIG. 1. If non-cosmetic structure 210 includes an edge, through-hole, cavity, threaded hole, or any other feature or combination thereof, each of layers 220, 230, and 240 can exist on each those features. This can ensure that each feature of non-cosmetic structure 210 has a desired cosmetic finish, which provides aesthetics and functional properties.

Qualification layer 220 can include one or more materials that prepare non-cosmetic structure 210 for an aluminum electroplating process. For example, qualification layer 220 can include a nickel layer. As another example, qualification layer 220 can include a copper layer and a nickel layer, which may be deposited on top of the copper layer. Layer 220 may be applied to structure 210 using any suitable process, including, for example, an immersion bath, electroplating, electroless plating, sputtering, or physical vapor deposition (PVD).

Qualification layer 220 can serve as a bonding surface for electroplated aluminum layer 230, and as such layer 230 can follow the contours and placement of layer 220. Because layer 230 may mimic placement of layer 220, it is desirable for layer 230 to be deposited on non-cosmetic structure 210 such that it forms a uniform coating of a predetermined thickness. The thickness may range between 5 um and 20 um, and in some embodiments may be about 10 um. Although it is desirable to have a uniform thickness, it is understood that the thickness of layer 220 may vary throughout. For example, layer 220 may vary in thickness by a few microns. In addition, it is further understood that the thickness of layer 220 may vary (e.g., from 10 um to 20 um) depending on the feature being coated. For example, the thickness of layer 220 on a relatively large planer surface may be greater than the thickness of layer 220 on a cavity or threaded insert.

The uniformity of the coating of layer 220 may be such that no or substantially no gaps or pores exist that will expose non-cosmetic structure 210. A uniform coating of layer 220 can ensure that electroplated aluminum layer 230 is continuously distributed across structure 210.

Electroplated aluminum layer 230 is a layer of aluminum or alloy thereof that is electroplated on top of qualification layer 220. Electroplating is a plating process in which metal ions in a solution are moved by an electric field to coat an electrode. The solution may include an electrolytic bath of toluene or ionic liquid from which an aluminum salt can be reduced. The electrode may be the combination of structure 210 and layer 220. The process can be regulated by controlling a variety of parameters, including voltage, amperage, temperature, dwell time, and purity of solution. It should be appreciated that parameters of the electroplating process may be adjusted depending on physical characteristics (e.g., shape) of structure 210. For example, layer 230 may be thicker at edges of structure 210. As another example, curved portions of structure 210 may be plated with aluminum or aluminum alloy in a manner that compensates for the curves.

Aluminum electroplated layer 230 can have any suitable thickness. For example, the thickness of layer 230 can vary between 10 and 120 microns, between 10 um and 75 um, 18 um and 25 um. In some embodiments, the thickness can be 10 microns, 18 microns, 33 microns, 50 microns, or 75 microns. It may be desirable that layer 230 not exceed a maximum thickness to prevent variability in the surface. It may also be desirable for layer 230 to have at least a minimum thickness to accommodate a processing step that removes a portion of layer 230 before it is anodized and to ensure structural reliability of layer 230. The processing step may remove any suitable amount of layer 230 to achieve desired results (e.g., a matte or mirror surface). The processing step may blast away or etch away a portion of layer 230 to provide a matte surface. It should be appreciated that parameters of the surface finishing process may be adjusted depending on physical characteristics (e.g., shape) of structure 210. For example, an amount of layer 230 being removed from a planar surface may be different from an amount of layer 230 being removed from sharp curves or edges. In addition, or alternatively, the processing step can lathe or polish away a portion of layer 230 to provide a mirror finish.

In some embodiments, a minimum thickness of 10 um of layer 230 may be too thin to polish, but may be suitable for obtaining a textured or matte finish. As another example, a minimum thickness of 18 um of layer 230 may be required to achieve a mirror finish. It should be appreciated that the minimum thickness of layer 230 required for achieving any of the textured or mirror finish may depend on the material selected in structure 210. For example, the thickness of the electroplated aluminum layer may be based on a stiffness of the non-cosmetic structure. As another example, a glass substrate may require a thicker layer 230 than a steel substrate in order to prevent cracking.

Electroplating with aluminum, rather than with other materials, can provide certain benefits for a finished part, including, but not limited to, cosmetic appeal, desired thermal qualities, structural reliability, and flexibility during manufacturing, and corrosion resistance. In addition, the soft property of aluminum can be leveraged during manufacturing (e.g., laser marking/etching and/or machining can be performed on an aluminum plated part), work hardened materials can be plated with aluminum, and a non-cosmetic part may even be colored first prior to being plated with aluminum.

Anodized aluminum layer 240 may be a layer wherein a surface portion of electroplated aluminum layer 230 is anodized. Anodizing can increase corrosion resistance and surface hardness (e.g., to prevent scratching) of aluminum layer 230. In addition, anodizing can permit coloring of aluminum layer 230. Anodized aluminum layer 240 can have any suitable thickness. In some embodiments, layer 230 can be anodized via direct electrical current (DC) or via pulses of current (e.g., pulse anodization), where layer 230 may be bathed (e.g., in sulfuric acid) to convert at least a portion of the surface of layer 230 into aluminum oxide. In some embodiments, the thickness of the aluminum oxide layer may be 35 microns or less. For example, the thickness can be about 10 microns. In other embodiments, the thickness can range between 5 and 35 microns, 10 and 30 microns, and 10 and 20 microns. Therefore, layer 230 may need to have an initial thickness greater than the desired thickness of layer 240, so that sufficient electroplated aluminum is available for conversion.

It should also be appreciated that, because the anodization process may result in a cloudy aluminum oxide layer, steps can be taken to improve the clarity thereof.

For example, if pulse anodization is employed, the pulses of current can be adjusted to achieve improved clarity. In addition, additional processing steps (e.g., polishing and texturing) may be also applied to layer 240.

Figure 3:
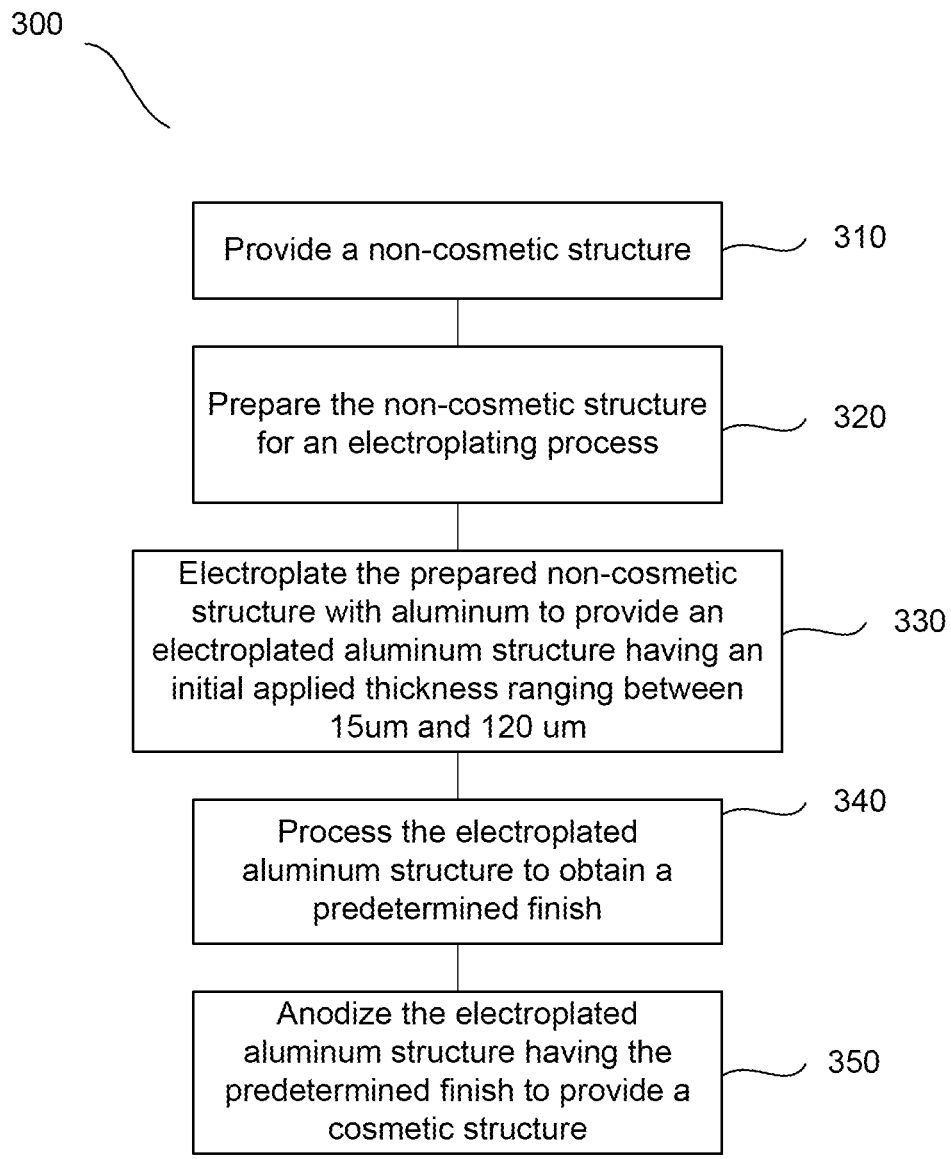
FIG. 3 shows an illustrative process for manufacturing a cosmetic structure having an anodized electroplated aluminum surface according to an embodiment of the invention.

FIG. 3 shows an illustrative process 300 for manufacturing a cosmetic structure having an anodized electroplated aluminum surface according to an embodiment of the invention. Beginning at step 310, a non-cosmetic structure (e.g., non-cosmetic structure 210) can be provided. The non-cosmetic structure can be any suitable shape or construction and can be constructed from a metal, a plastic, or combination thereof. See discussion of structure 100 above for additional details for suitable non-cosmetic structures.

At step 320, the non-cosmetic structure may be processed or prepared for an electroplating step. In some embodiments, certain parts or portions of the non-cosmetic structure can be masked so that the masked portion will not be cosmetically finished. The non-cosmetic structure may be prepared by being cleaned (e.g., to remove impurities, grease, or any oxidation buildup). The non-cosmetic structure can also be prepared by receiving a qualification layer. If desired, the non-cosmetic structure can be polished or textured prior to or after the cleaning step. The qualification layer, as discussed above in connection with FIG. 2, may include a nickel layer or a copper layer that is then covered by a nickel layer. For example, the nickel layer may have a particular optical characteristic (e.g., a particular brightness). As also discussed above, qualification layer may uniformly coat all desired features of the non-cosmetic structure. If desired, the qualification layer can also be polished, textured, or subjected to one or more rinse solvents. In some embodiments, the qualification layer may further be masked with any suitable material.

At step 330, the processed non-cosmetic structure may be electroplated with aluminum. In some embodiments, the electroplating step may include the use of toluene, ionic liquid, aluminum sulphite/sulphate, and/or any other suitable material. After an electroplated aluminum layer of desired thickness is deposited onto the non-cosmetic structure, the process may proceed to step 340. At step 340, the electroplated aluminum layer may be processed to attain a desired finish. Depending on how the electroplated aluminum layer is processed, it can exhibit, for example, a mirror-like finish or a matte finish.

In some embodiments, the electroplated aluminum layer may first be textured by a blasting and/or an etching process (e.g., laser etching), and subsequently surface finished. Surface finishing may, for example, involve localized processing of the electroplated aluminum layer using a targeted or targeting process. Any of a blast process, etching (e.g., laser etching), a physical mask, and/or any other suitable finishing process may be applied as part of surface finishing the electroplated aluminum layer.

At step 350, the processed electroplated aluminum structure may be anodized. The anodizing step can optionally include any of dye coloring and sealing. Sealing may include the use of any suitable material that may allow for the anodized layer to be further electroplated and/or anodized, if desired. In embodiments that include dye coloring and sealing, for example, a subsequent surface finish may also be performed on any visible or non-visible portion of the anodized electroplated aluminum layer. Such surface finishing of the anodized layer may, for example, include polishing, etching (e.g., of graphics and/or of artwork), engraving, CNC milling, and/or drilling microperforations therein. Following step 350, an anodized electroplated aluminum structure with appealing cosmetics and functional properties may be provided, and any other components may be attached to the cosmetic structure to form at least a part of an assembly.

One or more of the steps 310, 320, 330, 340, and 350 may be performed by automated machinery in a controlled environment devoid of oxygen. For example, the steps may be performed in a nitrogen only atmosphere. It is understood that additional steps may be added without departing from the spirit of the invention. For example, a cleaning step may be added after the completion of step 330. As another example, an additional aluminum coating step may be used to coat the non-cosmetic structure with aluminum. The additional aluminum coating step may be implemented by physical vapor deposition, thermal spray, or cold spray. This coating step may be applied before or after the electroplating step.

Figure 4:
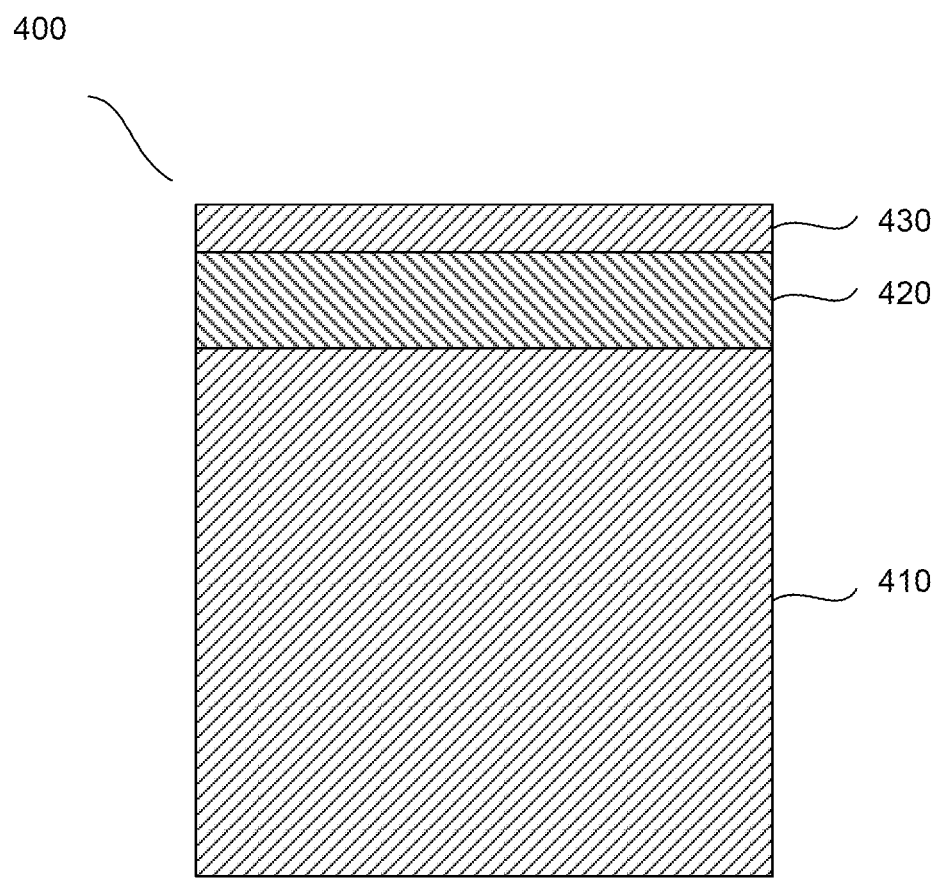
FIG. 4 shows an illustrative cross-sectional view of a cosmetic structure with aluminum plated on an aluminum structure in accordance with an embodiment of the invention.

In some embodiments, an aluminum or aluminum alloy substrate or structure can be electroplated with aluminum or aluminum alloy. FIG. 4 shows an illustrative cross-sectional view of a cosmetic structure with aluminum plated on an aluminum structure in accordance with an embodiment of the invention. Similar to cosmetic structure 200 of FIG. 2, cosmetic structure 400 can include non-cosmetic aluminum structure 410, electroplated aluminum layer 420, and anodized layer 430. However, cosmetic structure 400 may lack a qualification layer (e.g., layer 220 of FIG. 2). In some embodiments, to overcome potential difficulties in achieving aluminum plating on an aluminum substrate, an existing oxide layer on the aluminum substrate may first be removed (e.g., preferably in a sealed environment devoid of oxygen) prior to plating the aluminum structure with aluminum. With an existing oxide layer removed, aluminum may then be electroplated much more easily onto the aluminum structure. This can result in decreased manufacturing costs (e.g., a qualification layer is no longer required) and can maintain structural integrity of a finished cosmetic structure (e.g., any corrosion of a qualification layer can be avoided).

Figure 5:
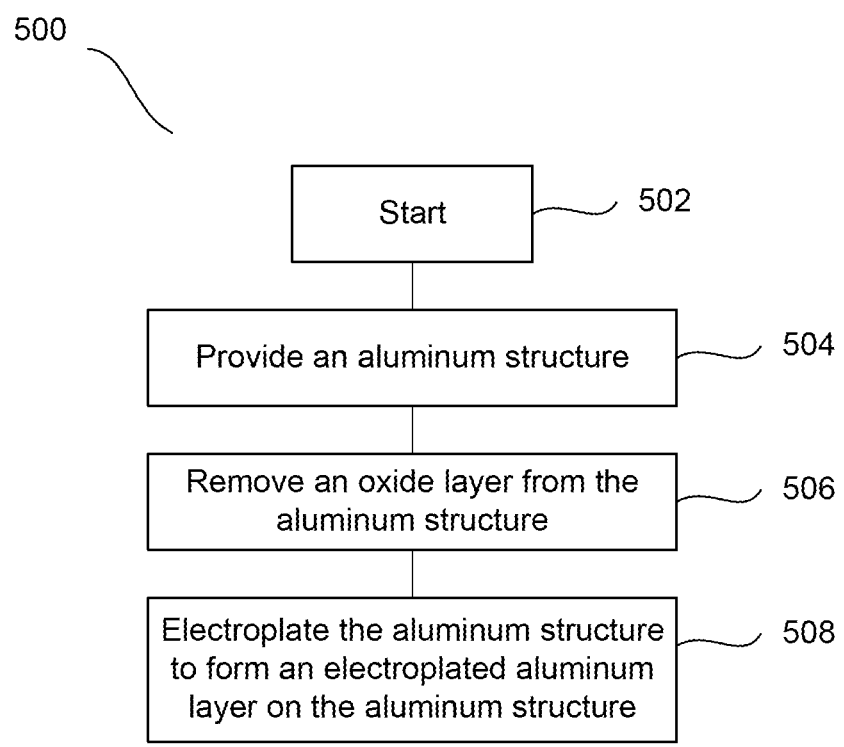
FIG. 5 shows an illustrative process for manufacturing a cosmetic structure having an anodized electroplated aluminum surface on an aluminum structure in accordance with an embodiment of the invention.

FIG. 5 shows an illustrative process for manufacturing a cosmetic structure having an anodized electroplated aluminum surface on an aluminum structure. Process 500 may begin at step 502. At step 504, a non-cosmetic aluminum structure (e.g., structure 410) may be provided.

At step 506, an existing oxide layer (not shown) on the non-cosmetic aluminum structure may be removed. Any suitable chemical process may be applied to the surface of the non-cosmetic aluminum structure, for example, to remove any oxide layer that may be present. At step 508, after the oxide layer is removed from the non-cosmetic aluminum structure, the non-cosmetic aluminum structure may be electroplated with aluminum. As discussed above in connection with FIG. 2, it should be appreciated that any parameters of the electroplating process (e.g., voltage, current, temperature, and dwell time) can be controlled to produce a desired thickness and quality of the electroplated aluminum layer. In some embodiments, a finishing process can be performed immediately after step 508 to attain a desired finish for the electroplated aluminum layer (e.g., layer 420). For example, depending on how the electroplated aluminum layer is processed, it can exhibit a mirror like finish or a matte finish.

Though not shown, after step 508, the electroplated aluminum structure may be anodized. In some embodiments, a dye coloring process can be performed during the anodizing in order to achieve a coloring effect. Following the anodizing, a cosmetic structure having an anodized electroplated aluminum surface on an aluminum structure may be provided.

Figure 6:
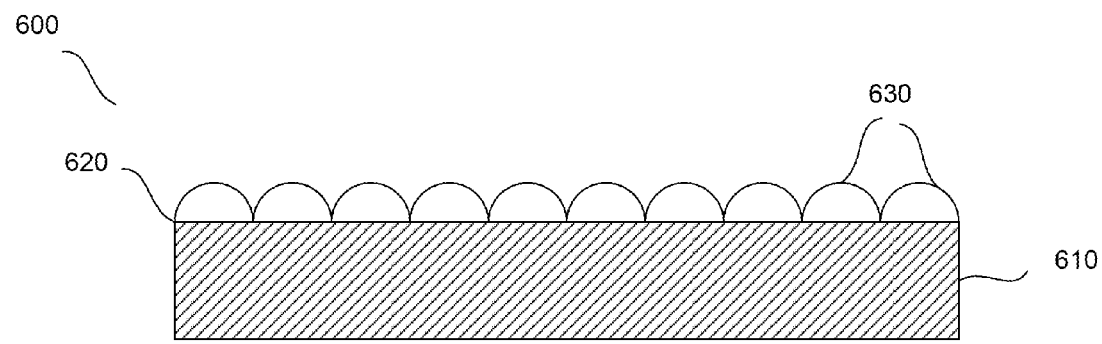
FIG. 6 shows an illustrative cross-sectional view of a surface of at least one of an electroplated layer and an anodized layer of a cosmetic structure in accordance with an embodiment of the invention.

In some embodiments, the hardness of an electroplated layer (e.g., layer 420) can be controlled. For example, electroplating of a non-cosmetic structure may include immersing the non-cosmetic structure in a first bath of aluminum or aluminum alloy solution having a particular grain structure (or size), and subsequently immersing the electroplated non-cosmetic structure in a second bath of aluminum or aluminum alloy solution having a different grain structure (or size). As another example, the non-cosmetic structure may be immersed in a bath of aluminum or aluminum alloy solution having a mixed grain structure (or mixed grain sizes). In particular, the mixed grain structure (or sizes) may be produced by mixing a first aluminum or aluminum alloy solution having a particular grain structure (or size) with a second solution (e.g., of aluminum or of any other suitable type of element) having a different grain structure (or size). In this manner, one or more properties of an electroplated layer's surface can be modified (e.g., chemically) to provide a desired structural integrity. In some embodiments, the aluminum or aluminum alloy solution to be electroplated may be modified with one or more dopants to produce a hardness quality of grains. It should be appreciated that any suitable type of material may be used to dope the aluminum or aluminum alloy solution, as long as a resulting electroplated layer exhibits a desired hardness quality. In some embodiments, 99.99% pure aluminum may be used for the electroplating, which may allow for better control of the thickness of the grain structure. For example, various aluminum and dopant baths may be mixed in any suitable manner and used in electroplating to control the thickness of the grain structure of a resulting electroplated layer. FIG. 6 shows an illustrative cross-sectional view 600 of a surface of at least one of an electroplated layer of a cosmetic structure in accordance with an embodiment of the invention. Layer 610 can include surface 620, which can include a pattern of grains 630 that at least partially defines a structural characteristic of layer 610.

Figure 6A:
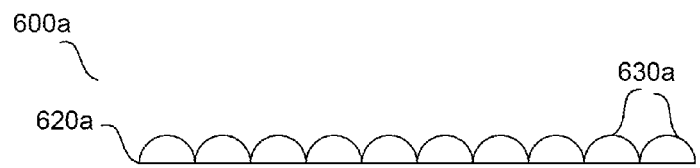
FIG. 6A shows an illustrative cross-sectional view of a surface of at least one of an electroplated layer and an anodized layer of a cosmetic structure having a particular grains structure in accordance with an embodiment of the invention.
Figure 6B:
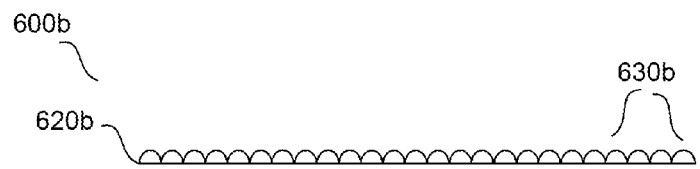
FIG. 6B shows an illustrative cross-sectional view of a surface of at least one of an electroplated layer and an anodized layer of a cosmetic structure having a particular grains structure in accordance with an embodiment of the invention.

FIG. 6A shows an illustrative cross-sectional view of a surface of at least one of an electroplated layer and an anodized layer of a cosmetic structure having a particular grains structure in accordance with an embodiment of the invention. Surface 620*a* of cosmetic structure 600*a* can include a pattern of grains 630*a* having a relatively large or rough grain structure. FIG. 6B shows an illustrative cross-sectional view of a surface of at least one of an electroplated layer and an anodized layer of a cosmetic structure having a particular grains structure in accordance with an embodiment of the invention. Surface 620b of cosmetic structure 600b can include a pattern of grains 630b having a relatively small or fine grain structure, in contrast to pattern of grains 630a.

Figure 6C:
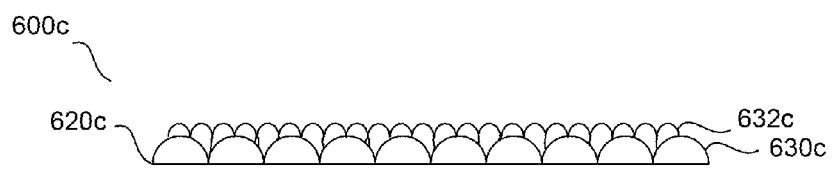
FIG. 6C shows an illustrative cross-sectional view of a surface of at least one of an electroplated layer and an anodized layer of a cosmetic structure having a particular grains structure in accordance with an embodiment of the invention.
Figure 6D:
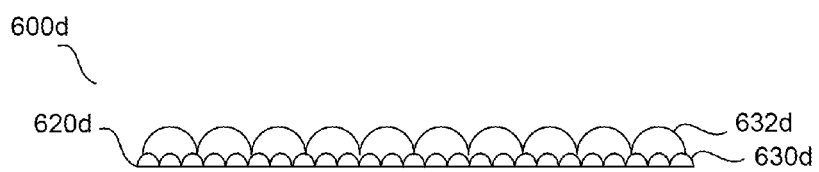
FIG. 6D shows an illustrative cross-sectional view of a surface of at least one of an electroplated layer and an anodized layer of a cosmetic structure having a particular grains structure in accordance with an embodiment of the invention.

In some embodiments, the electroplated layer and/or the anodized layer may be controlled to include layered patterns of grains each having relatively different grain structures. FIG. 6C shows an illustrative cross-sectional view of a surface of at least one of an electroplated layer and an anodized layer of a cosmetic structure having a particular grains structure in accordance with an embodiment of the invention. Surface 620c of cosmetic structure 600c can include a lower pattern of grains 630c having a relatively large or rough grain structure and an upper pattern of grains 632c having a relatively small or fine grain structure. FIG. 6D shows an illustrative cross-sectional view of a surface of at least one of an electroplated layer and an anodized layer of a cosmetic structure having a particular grains structure in accordance with an embodiment of the invention. Surface 620d of cosmetic structure 600d can include a lower pattern of grains 630d having a relatively small or fine grain structure and an upper pattern of grains 632d having a relatively large or rough grain structure, in contrast to layer 610.

Figure 7:
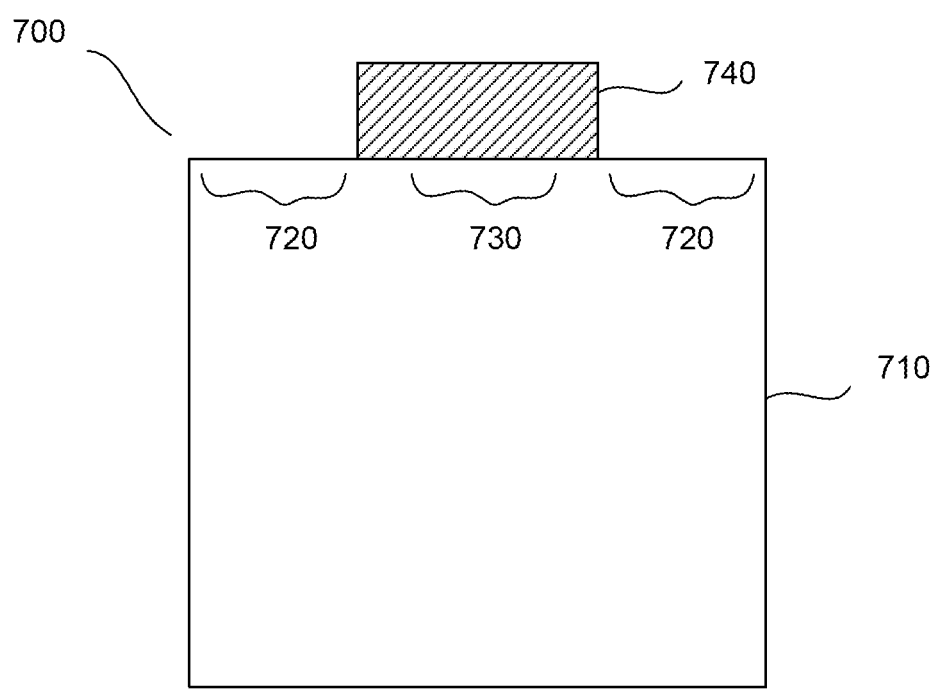
FIG. 7 shows an illustrative cross-sectional view of a selectively electroplated cosmetic structure in accordance with an embodiment of the invention.

In some embodiments, a non-cosmetic structure may be selectively electroplated to provide a selectively plated cosmetic structure. This can yield a desired cosmetic appearance on select portions of a non-cosmetic structure. FIG. 7 shows an illustrative cross-sectional view of a selectively electroplated cosmetic structure in accordance with an embodiment of the invention. Cosmetic structure 700 may include non-cosmetic structure 710, non-plated portions 720, electroplated portion 730, and electroplated layer 740. Though not shown, in some embodiments, cosmetic structure 700 may also include a qualification layer similar to layer 220 of cosmetic structure 200. In addition, it should be appreciated that cosmetic structure 700 may further include an anodized layer (e.g., similar to layer 240 of FIG. 2).

Figure 8:
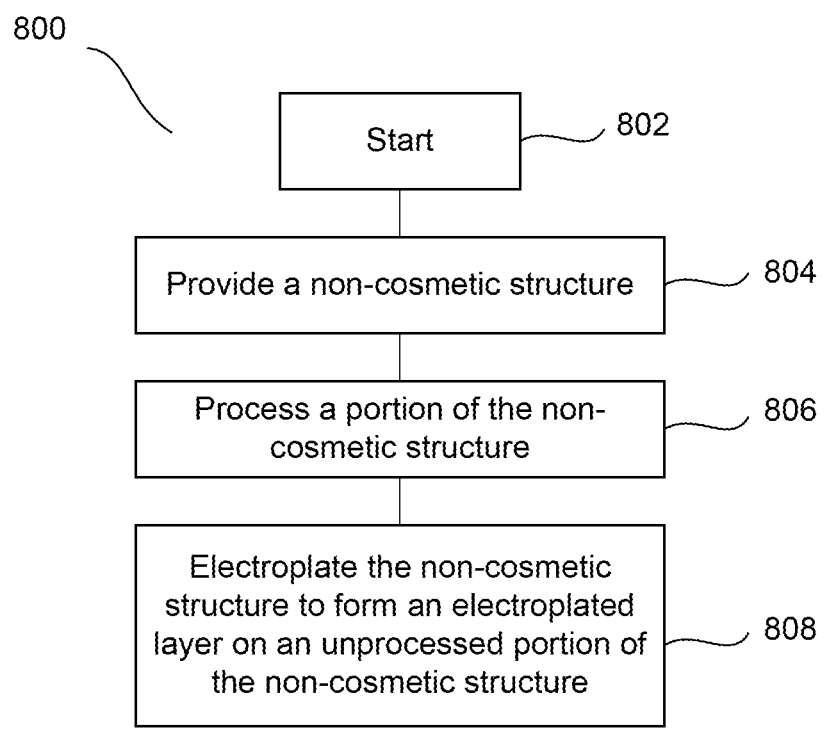
FIG. 8 shows an illustrative process for manufacturing a cosmetic structure by selective electroplating according to an embodiment of the invention.

FIG. 8 shows an illustrative process for manufacturing a cosmetic structure by selective electroplating according to an embodiment of the invention. Process 800 may begin at step 802. At step 804, a non-cosmetic structure (e.g., structure 710) may be provided. At step 806, portions of the non-cosmetic structure that are not to be electroplated (e.g., non-plated portions 720) may be masked or laminated. It should be appreciated that masking or lamination of the non-cosmetic structure may be achieved using any suitable type of material. At step 808, the masked or laminated non-cosmetic structure may be electroplated (e.g., with aluminum or any suitable type of material). With portions of the non-cosmetic structure being masked or laminated, only uncovered portion(s) (e.g., electroplated portion 730) of the structure may be electroplated at step 808. Though not shown, the mask or laminating material may be removed at any time after electroplating is complete of the uncovered portion(s) is complete.

Figure 9:
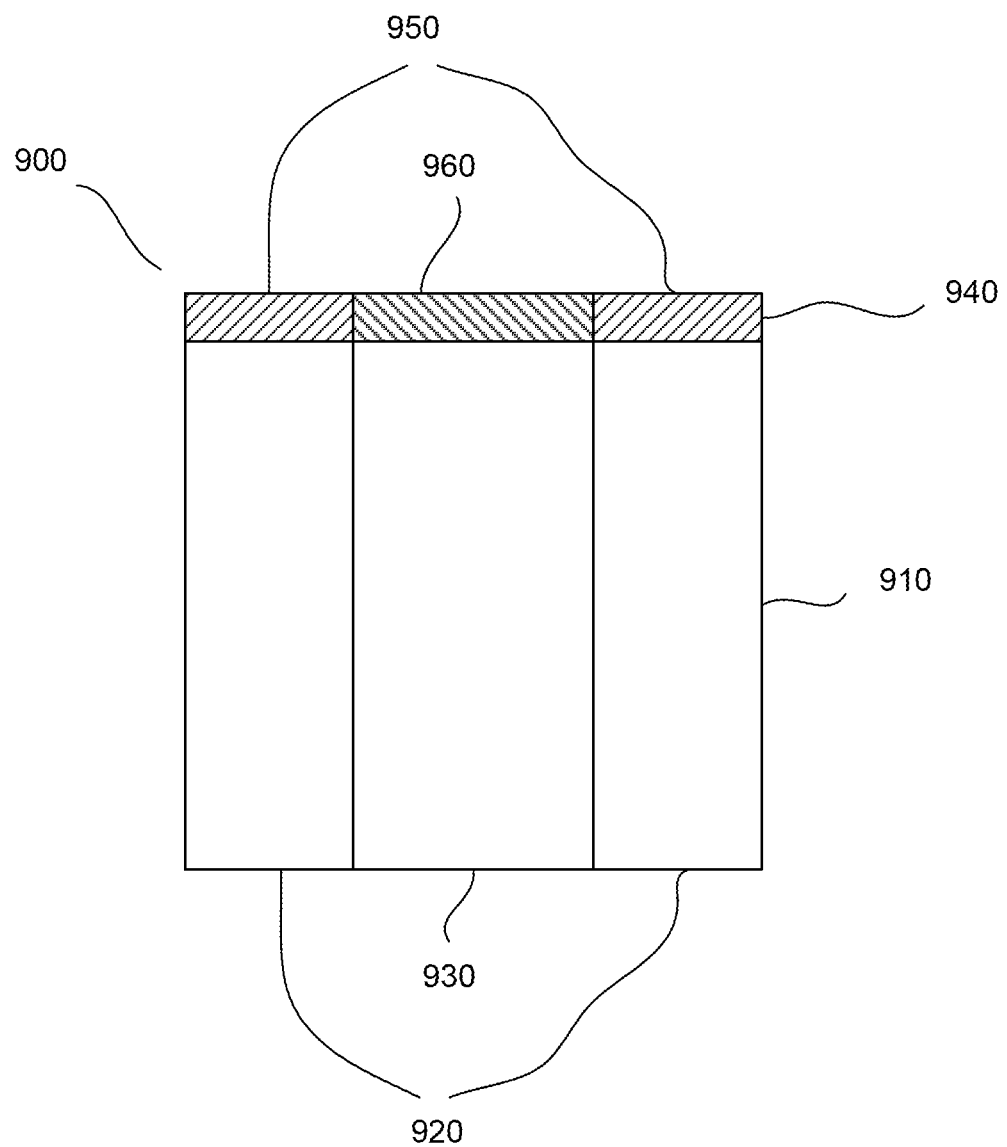
FIG. 9 shows an illustrative cross-sectional view of a cosmetic structure including multiple substrates in accordance with an embodiment of the invention.

In some embodiments, a non-cosmetic structure may include two or more types of material, where a different finish on each type of material may be desired. FIG. 9 shows an illustrative cross-sectional view of a cosmetic structure including multiple substrates in accordance with an embodiment of the invention. Cosmetic structure 900 may include non-cosmetic structure 910, which may be constructed of structural portions 920 of one material type (e.g., aluminum) and a structural portion 930 of another material type (e.g., ceramic), and electroplated layer 940. Electroplated layer 940 may include first finished portions 950 overlaid on structural portions 920, and a second finished portion 960 overlaid on structural portion 930. Though not shown, in some embodiments, cosmetic structure 900 may also include a qualification layer similar to layer 220 of cosmetic structure 200.

Figure 10:
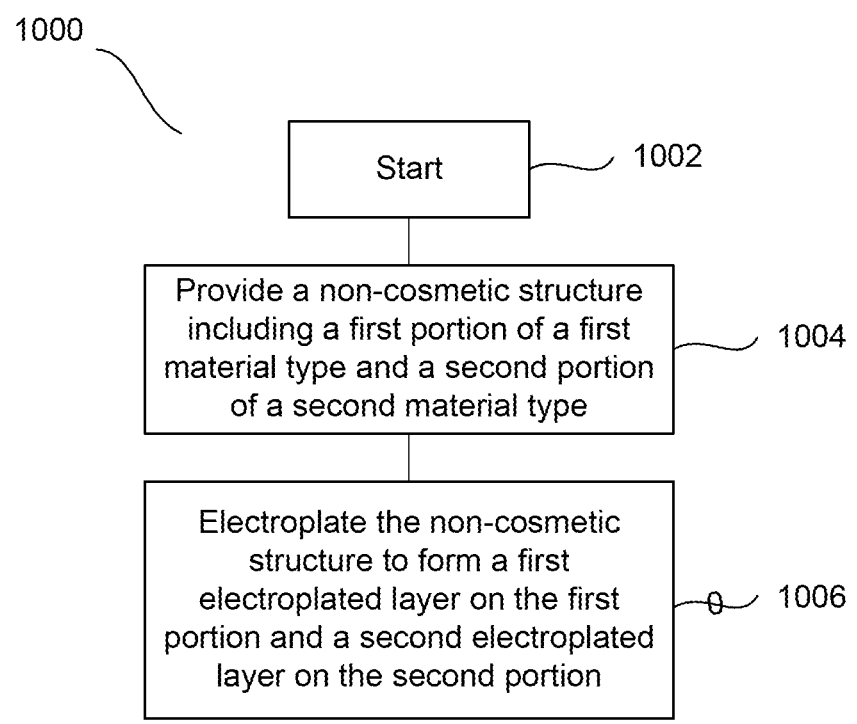
FIG. 10 shows an illustrative process for manufacturing a cosmetic structure including multiple substrates according to an embodiment of the invention.

FIG. 10 shows an illustrative process for manufacturing a cosmetic structure including multiple substrates according to an embodiment of the invention. Process 1000 may begin at step 1002. At step 1004, a non-cosmetic structure (e.g., non-cosmetic structure 910) may be provided. The non-cosmetic structure may include one or more structural portions of one material type (e.g., structural portions 920) and one or more portions of another material type (e.g., structural portion 930).

At step 1006, the non-cosmetic structure may be electroplated to form an electroplated layer. Depending on properties of the non-cosmetic structure that is directly beneath the electroplated layer, one portion of the electroplated layer may have properties that are different from those of another portion of the electroplated layer. In some embodiments, after step 1006, the electroplated layer may be surface finished. Due to the different material properties of the different portions of the non-cosmetic structure, a characteristic of one or more portions of an electroplated layer (e.g., first finished portions 950) that is deposited on the one or more structural portions of one material type (e.g., structural portions 920) may be different from a characteristic of one or more portions of the electroplated layer (e.g., second finished portion 960) that is deposited on the one or more of the structural portions of another material type (e.g., structural portion 930). For example, if the non-cosmetic structure includes one or more aluminum portions and one or more ceramic portions, surface finishing an electroplated layer may result in a portion of the electroplated layer deposited on the aluminum portions to exhibit a matte finish, and a portion of the electroplated layer deposited on the ceramic portions to exhibit a clear finish.

Figure 11:
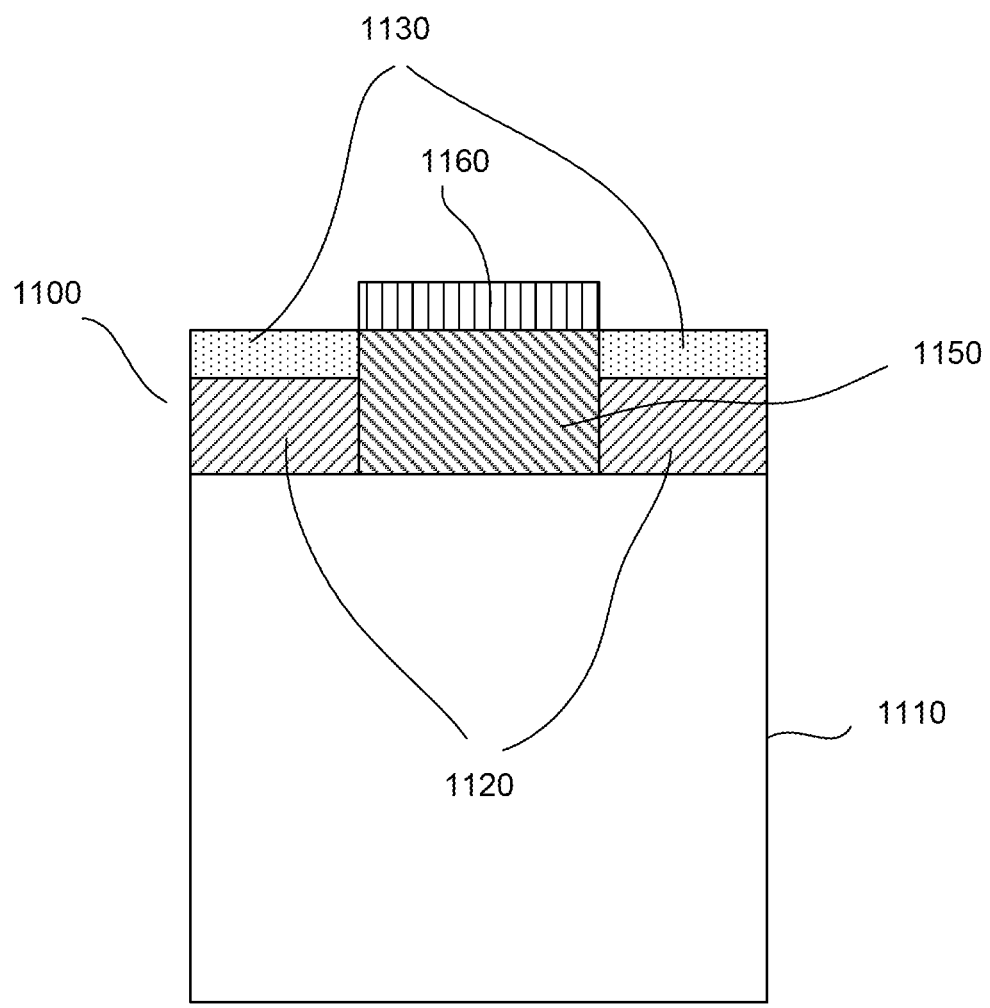
FIG. 11 shows an illustrative cross-sectional view of a double anodized cosmetic structure in accordance with an embodiment of the invention.

In some embodiments, a non-cosmetic structure may be plated and anodized more than once (e.g., two times) to provide a finished cosmetic structure that may include a desired pattern of surface texture and/or colors. For example, a non-cosmetic structure may be electroplated (e.g., with aluminum) to form a first electroplated layer. The first electroplated layer may then be anodized to form a first anodized layer over the first electroplated layer, and a portion of the first electroplated layer and a portion of the first anodized layer may each be removed. As a result, a recess may be created between remaining portions of the first electroplated layer and the first anodized layer, and a second electroplated layer may be formed in the recess. A second anodized layer may then be formed over the second electroplated layer, resulting in a double anodized cosmetic structure. Such a double anodization process may eliminate any need to mask portions of the non-cosmetic structure during manufacturing. FIG. 11 shows an illustrative cross-sectional view of a double anodized cosmetic structure in accordance with an embodiment of the invention. Cosmetic structure 1100 may include non-cosmetic structure 1110, first electroplated layer portions 1120 (e.g., of aluminum), first anodized layer portions 1130, second electroplated layer portion 1150, and second anodized layer portion 1160. Though not shown, in some embodiments, cosmetic structure 1100 may also include one or more qualification layers similar to layer 220 of cosmetic structure 200. Though cosmetic structure 1100 is shown to have a particular pattern of electroplated and anodized layers, it should be appreciated that any suitable design or pattern of each of these layers may be achieved with double anodization.

Figure 12:
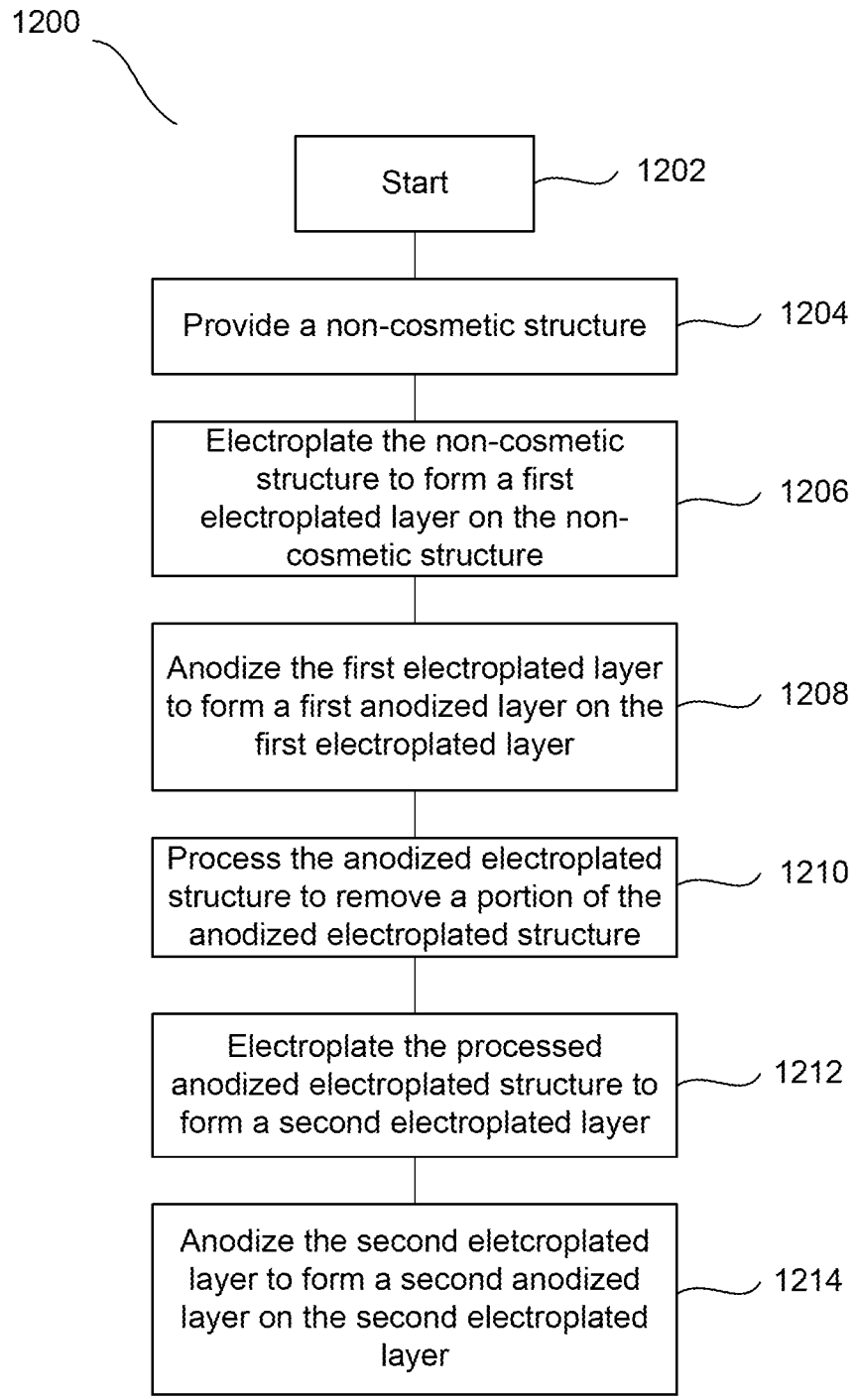
FIG. 12 shows an illustrative process for manufacturing a cosmetic structure by double anodization according to an embodiment of the invention.

FIG. 12 shows an illustrative process for manufacturing a cosmetic structure by double anodization according to an embodiment of the invention. Process 1200 may begin at step 1202. At step 1204, a non-cosmetic structure (e.g., non-cosmetic structure 1110) may be provided.

At step 1206, the non-cosmetic structure may be electroplated (e.g., with aluminum) to form an electroplated layer (e.g., including first electroplated layer portions 1120 and one or more other first electroplated layer portions that are not shown). In some embodiments, a finishing process can be performed immediately after step 1206 to attain a desired finish of the electroplated layer. For example, depending on how the electroplated aluminum layer is processed, it can exhibit a mirror like finish or a matte finish.

At step 1208, the electroplated structure may be anodized to form an anodized layer (e.g., first anodized layer portions 1130 and one or more other first anodized layer portions that are not shown). In some embodiments, a dye coloring process can be performed during anodizing step 1208 in order to achieve a coloring effect.

At step 1210, the anodized electroplated structure may be processed to remove a portion of the anodized electroplated structure. As a result, what remains of the anodized electroplated structure may function as a mask for use during further steps of the manufacturing of the cosmetic structure. The modification can include, for example, cutting (e.g., via laser etching) one or more portions of the first anodized layer (e.g., first anodized layer portions (not shown) other than first anodized layer portions 1130) and electroplated layer (e.g., first electroplated layer portions (not shown) other than first electroplated layer portions 1120) to create one or more recesses (not shown, but may be at least partially occupied by second electroplated layer portion 1150 and second anodized layer portion 1160).

At step 1212, the modified anodized electroplated structure may be further electroplated to form one or more second electroplated layers (e.g. electroplated layer portion 1150). This second electroplated layer may be processed to attain a desired finish. At step 1214, a second anodization process may be performed on the second electroplated structure. Anodizing step 1214 may optionally include dye coloring. Following step 1214, a double anodized electroplated structure with appealing cosmetics and functional properties may be provided.

In some embodiments, a dye coloring process performed during the first anodizing step 1206 may employ a dye color different from that employed in a dye coloring process performed during the second anodizing step 1212. It should be appreciated that step 1210 can be performed at any time after step 1206 (e.g., prior to surface finishing the electroplated layer). Further, the first electroplated layer may be formed from a material that is different from a material that forms the second electroplated layer. For example, the first electroplated layer may be formed from aluminum, whereas the second electroplated layer may be formed from nickel.

Figure 13:
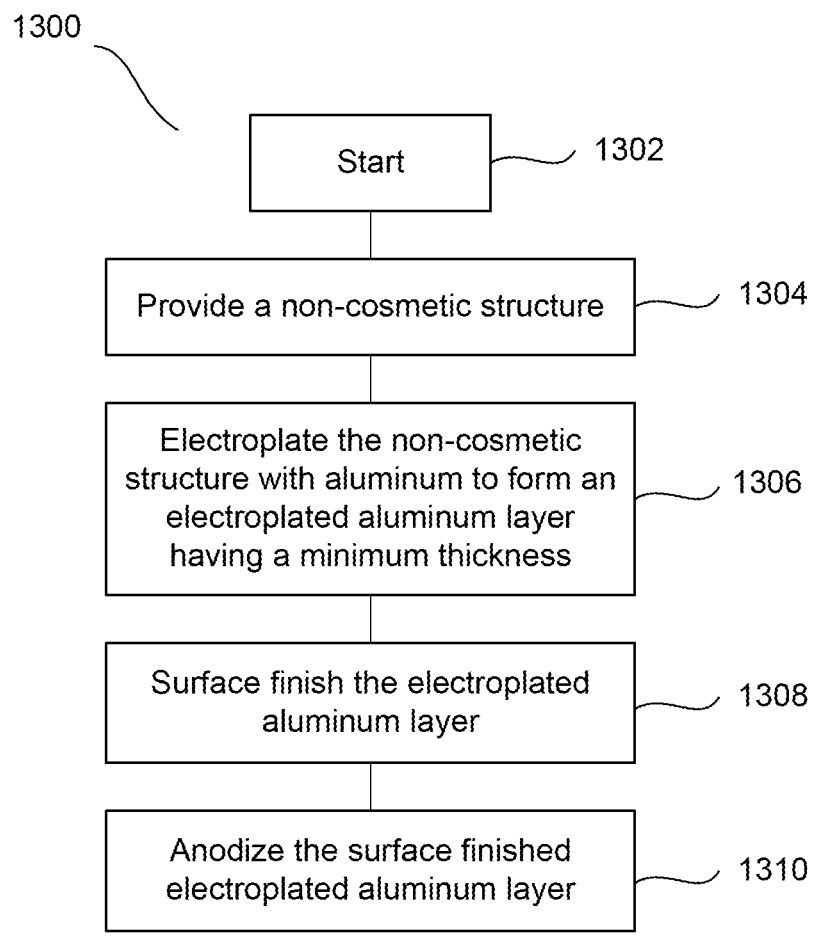
FIG. 13 shows an illustrative process for manufacturing a cosmetic structure with an electroplated aluminum layer having a minimum thickness according to an embodiment of the invention.

FIG. 13 shows an illustrative process for manufacturing a cosmetic structure with an electroplated aluminum layer having a minimum thickness according to an embodiment of the invention. Process 1300 may begin at step 1302. At step 1304, a non-cosmetic structure (e.g., non-cosmetic structure 210) may be provided.

At step 1306, the non-cosmetic structure may be electroplated with aluminum. As discussed above in connection with FIG. 2, it may be desirable for an electroplated aluminum layer to have a minimum thickness to accommodate a processing step that removes a portion of the electroplated aluminum layer before it is anodized and to ensure structural reliability. Thus, the electroplating of step 1306 may include electroplating the non-cosmetic structure such that the electroplated aluminum layer has a minimum thickness. As discussed above in connection with FIG. 2, it should be appreciated that the minimum thickness of the electroplated aluminum layer required for achieving any of the textured or mirror finish may depend on a type of material of the non-cosmetic structure. For example, the thickness of the electroplated aluminum layer may be based on a stiffness of the non-cosmetic structure. As another example, a glass substrate may require a thicker layer 230 than a steel substrate in order to prevent cracking.

At step 1308, the electroplated aluminum layer may be surface finished. For example, a minimum thickness of 10 um of the electroplated aluminum layer may be too thin to polish, but may be required in order to achieve a textured finish. As another example, a minimum thickness of 18 um of layer 230 may be required to achieve a mirror finish. At step 1310, the surface finished electroplated aluminum layer may be anodized. In some embodiments, a dye coloring process can be performed during anodizing step 1310 in order to achieve a coloring effect.

Though not shown, in some embodiments, the electroplated aluminum layer can be deposited onto the non-cosmetic structure in separate layers. For example, to control the thickness of the electroplated aluminum layer, a rough electroplated aluminum layer and a fine electroplated aluminum layer may separately be deposited. The rough electroplated aluminum layer may first be applied onto the non-cosmetic structure to serve as a base layer of aluminum, where the fine electroplated aluminum layer may be subsequently applied on the rough layer. In some embodiments, the fine layer, rather than the rough layer, may first be applied onto the non-cosmetic structure.

Figure 14:
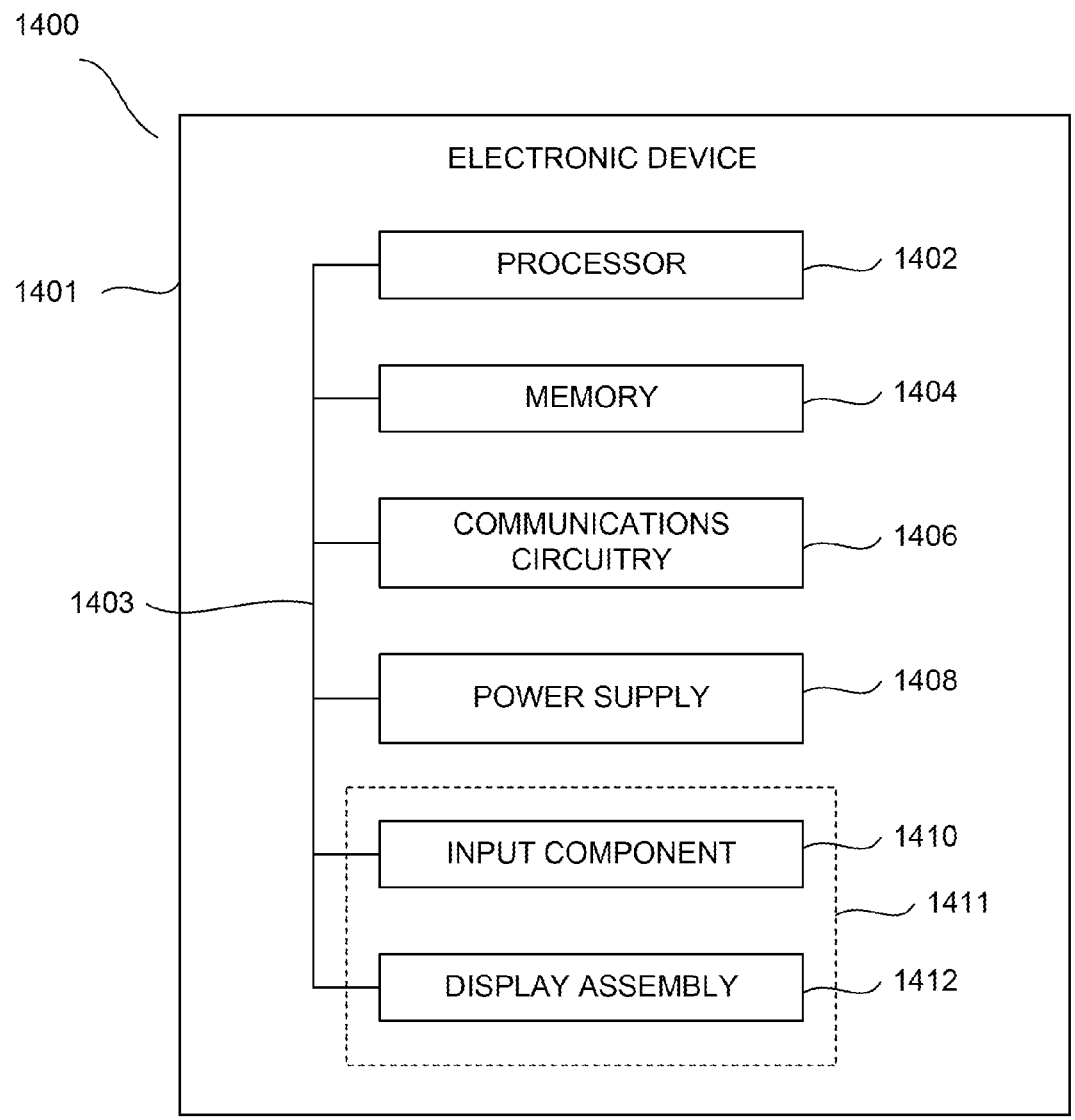
FIG. 14 is a schematic view of an illustrative electronic device in accordance with an embodiment of the invention.

FIG. 14 is a schematic view of an illustrative electronic device 1400 for displaying visible information to a user. Electronic device 1400 may be any portable, mobile, or hand-held electronic device configured to present visible information on a display assembly wherever the user travels. Alternatively, electronic device 1400 may not be portable at all, but may instead be generally stationary. Electronic device 1400 can include, but is not limited to, a music player, video player, still image player, game player, other media player, music recorder, movie or video camera or recorder, still camera, other media recorder, radio, medical equipment, domestic appliance, transportation vehicle instrument, musical instrument, calculator, cellular telephone, other wireless communication device, personal digital assistant, remote control, pager, computer (e.g., desktop, laptop, tablet, server, etc.), monitor, television, stereo equipment, set up box, set-top box, boom box, modem, router, keyboard, mouse, speaker, printer, and combinations thereof. In some embodiments, electronic device 1400 may perform a single function (e.g., a device dedicated to displaying image content) and, in other embodiments, electronic device 1400 may perform multiple functions (e.g., a device that displays image content, plays music, and receives and transmits telephone calls).

Electronic device 1400 may include a housing 1401, a processor or control circuitry 1402, memory 1404, communications circuitry 1406, power supply 1408, input component 1410, and display assembly 1412. Electronic device 1400 may also include a bus 1403 that may provide a data transfer path for transferring data and/or power, to, from, or between various other components of device 1400. In some embodiments, one or more components of electronic device 1400 may be combined or omitted. Moreover, electronic device 1400 may include other components not combined or included in FIG. 14. For the sake of simplicity, only one of each of the components is shown in FIG. 1.

Memory 1404 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 1404 may include cache memory, which may be one or more different types of memory used for temporarily storing data for electronic device applications. Memory 1404 may store media data (e.g., music, image, and video files), software (e.g., for implementing functions on device 1400), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 1400 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 1406 may be provided to allow device 1400 to communicate with one or more other electronic devices or servers using any suitable communications protocol. For example, communications circuitry 1406 may support Wi-Fi™ (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 1406 may also include circuitry that can enable device 1400 to be electrically coupled to another device (e.g., a computer or an accessory device) and communicate with that other device, either wirelessly or via a wired connection.

Power supply 1408 may provide power to one or more of the components of device 1400. In some embodiments, power supply 1408 can be coupled to a power grid (e.g., when device 1400 is not a portable device, such as a desktop computer). In some embodiments, power supply 1408 can include one or more batteries for providing power (e.g., when device 1400 is a portable device, such as a cellular telephone). As another example, power supply 1408 can be configured to generate power from a natural source (e.g., solar power using one or more solar cells).

One or more input components 1410 may be provided to permit a user to interact or interface with device 1400. For example, input component 1410 can take a variety of forms, including, but not limited to, a track pad, dial, click wheel, scroll wheel, touch screen, one or more buttons (e.g., a keyboard), mouse, joy stick, track ball, and combinations thereof. For example, input component 1410 may include a multi-touch screen. Each input component 1410 can be configured to provide one or more dedicated control functions for making selections or issuing commands associated with operating device 1400.

Electronic device 1400 may also include one or more output components that may present information (e.g., textual, graphical, audible, and/or tactile information) to a user of device 1400. An output component of electronic device 1400 may take various forms, including, but not limited, to audio speakers, headphones, audio line-outs, visual displays, antennas, infrared ports, rumblers, vibrators, or combinations thereof.

For example, electronic device 1400 may include display assembly 1412 as an output component. Display 1412 may include any suitable type of display or interface for presenting visible information to a user of device 1400. In some embodiments, display 1412 may include a display embedded in device 1400 or coupled to device 1400 (e.g., a removable display). Display 1412 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. Alternatively, display 1412 can include a movable display or a projecting system for providing a display of content on a surface remote from electronic device 1400, such as, for example, a video projector, a head-up display, or a three-dimensional (e.g., holographic) display. As another example, display 1412 may include a digital or mechanical viewfinder. In some embodiments, display 1412 may include a viewfinder of the type found in compact digital cameras, reflex cameras, or any other suitable still or video camera.

It should be noted that one or more input components and one or more output components may sometimes be referred to collectively as an I/O interface (e.g., input component 1410 and display 1412 as I/O interface 1411). It should also be noted that input component 1410 and display 1412 may sometimes be a single I/O component, such as a touch screen that may receive input information through a user's touch of a display screen and that may also provide visual information to a user via that same display screen.

Processor 1402 of device 1400 may control the operation of many functions and other circuitry provided by device 1400. For example, processor 1402 may receive input signals from input component 1410 and/or drive output signals to display assembly 1412. Processor 1402 may load a user interface program (e.g., a program stored in memory 1404 or another device or server) to determine how instructions or data received via an input component 1410 may manipulate the way in which information is provided to the user via an output component (e.g., display 1412). For example, processor 1402 may control the viewing angle of the visible information presented to the user by display 1412 or may otherwise instruct display 1412 to alter the viewing angle.

Electronic device 1400 may also be provided with a housing 1401 that may at least partially enclose one or more of the components of device 1400 for protecting them from debris and other degrading forces external to device 1400. In some embodiments, one or more of the components may be provided within its own housing (e.g., input component 1410 may be an independent keyboard or mouse within its own housing that may wirelessly or through a wire communicate with processor 1402, which may be provided within its own housing). All or a portion of housing 1401 can be finished, for example, to have an anodized electroplated aluminum finish according to embodiments of the invention.

The described embodiments of the invention are presented for the purpose of illustration and not of limitation.

What is claimed is:

1. A method for providing a cosmetic coating on a support structure for an electronic device, the method comprising:
depositing a qualification layer on a substrate surface of the support structure, the qualification layer configured to enhance bonding of a subsequently deposited aluminum layer, wherein depositing the qualification layer comprises:
  depositing a copper sub-layer of the qualification layer on the substrate surface of the support structure such that the copper sub-layer is continuously distributed along the substrate surface, and
  depositing a nickel sub-layer of the qualification layer on the copper sub-layer, the nickel sub-layer having an optical brightness different than the copper sub-layer;
polishing a surface of the nickel sub-layer of the qualification layer;
electroplating the aluminum layer on the polished surface of the nickel sub-layer, the aluminum layer having at least a minimum thickness for accommodating a subsequent anodizing operation that consumes at least a portion of the aluminum layer, wherein electroplating the aluminum layer comprises:
  electroplating a first portion of the aluminum layer on the qualification layer using a first dopant, the first portion of the aluminum layer having a first grain structure, and
  electroplating a second portion of the aluminum layer on the first portion of the aluminum layer using a second dopant different than the first dopant, the second portion having a second grain structure, the first grain structure different than the second grain structure; and
converting at least the portion of the aluminum layer to an aluminum oxide layer, wherein a top surface of the aluminum oxide layer corresponds to a top surface of the cosmetic coating.

2. The method of claim 1, wherein the optical brightness of the nickel sub-layer of the qualification layer imparts an optical quality to the cosmetic coating.

3. The method of claim 2, wherein the aluminum oxide layer is sufficiently clear such that the optical brightness of the nickel sub-layer of the qualification layer is viewable from a top surface of the cosmetic coating.

4. The method of claim 2 wherein the qualification layer has substantially no gaps that expose the substrate surface of the support structure.

5. The method of claim 1, wherein the qualification layer has thickness ranging from about 5 micrometers to about 20 micrometers.

6. The method of claim 1, wherein electroplating the aluminum layer comprises depositing the aluminum layer to a thickness ranging from about 10 micrometers and about 75 micrometers.

7. The method of claim 1, wherein the support structure comprises metal and plastic surfaces.

8. The method of claim 1, wherein electroplating the aluminum layer comprises electroplating the aluminum layer to a thickness ranging from about 13 micrometers to about 120 micrometers.

9. A method for forming a protective coating on a support structure of an electronic device, the method comprising:
  applying a qualification layer on a surface of the support structure, the qualification layer configured to enhance bonding of a subsequently deposited aluminum layer; and
  electroplating an aluminum layer on the qualification layer, wherein depositing the aluminum layer comprises:
    electroplating a first portion of the aluminum layer on the qualification layer using a first dopant, the first portion of the aluminum layer having a first grain structure, and
    electroplating a second portion of the aluminum layer on the first portion of the aluminum layer using a second dopant different than the first dopant, the second portion having a second grain structure, the first grain structure different than the second grain structure,
  wherein the first and second grain structures are associated with a hardness quality of the protective coating.

10. The method of claim 9, wherein applying the qualification layer comprises:
  depositing a first portion of a qualification layer on the surface of the support structure such that the first portion is continuously distributed along the surface, and
  depositing a second portion of the qualification layer on the first portion, the second portion chosen to have an optical brightness.

11. The method of claim 9, further comprising: subsequent to electroplating the second portion of the aluminum layer, converting at least a portion of the second portion to an aluminum oxide layer.

12. The method of claim 11, further comprising: prior to converting the second portion to an aluminum oxide layer, processing the electroplated second portion to obtain a surface finish.

13. A method for forming a protective coating on an aluminum part of an electronic device, the method comprising:
  chemically removing a pre-existing oxide layer from a surface of the aluminum part;
  electroplating a first aluminum layer on the chemically treated surface using a first dopant, the first aluminum layer having a first grain structure; and
  electroplating a second aluminum layer on the first aluminum layer using a second dopant different than the first dopant, the second aluminum layer having a second grain structure, the first grain structure different than the second grain structure,
  wherein the first and second grain structures are associated with a hardness quality of the protective coating.

14. The method of claim 13, wherein the first grain structure is larger than the second grain structure.

15. The method of claim 13, wherein the second grain structure is larger than the first grain structure.

16. The method of claim 13, further comprising:
  subsequent to electroplating the second aluminum layer, converting at least a portion of the second aluminum layer to an aluminum oxide layer.

17. The method of claim 16, further comprising converting at least a portion of the first aluminum layer to the aluminum oxide layer.

18. The method of claim 13, wherein chemically removing the pre-existing oxide layer is performed in a sealed environment substantially devoid of oxygen.

19. A method for forming a coating on a support structure of an electronic device, the method comprising:
  applying a qualification layer on a surface of the support structure, the qualification layer configured to enhance bonding of a subsequently deposited first aluminum layer;
  electroplating the first aluminum layer on the qualification layer using a first dopant, the first aluminum layer having a first grain structure; and
  electroplating a second aluminum layer on the first aluminum layer using a second dopant different than the first dopant, the second aluminum layer having a second grain structure, the first grain structure different than the second grain structure,
  wherein the first and second grain structures are associated with a hardness quality of the coating.

20. The method of claim 19, wherein the qualification layer has an optical characteristic that imparts an optical quality to the coating.

21. The method of claim 19, wherein depositing the qualification layer comprises depositing a first qualification layer on the surface of the support structure and depositing a second qualification layer on the first qualification layer.

22. The method of claim 19, further comprising: processing the electroplated second aluminum layer to obtain a surface finish.

* * * * *